(12) United States Patent
Mitani (10) Patent No.: US 12,400,900 B2
(45) Date of Patent: Aug. 26, 2025

(54) MANUFACTURING METHOD OF CHIPS AND TAPE STICKING APPARATUS

(71) Applicant: DISCO CORPORATION, Tokyo (JP)

(72) Inventor: Shuzo Mitani, Tokyo (JP)

(73) Assignee: DISCO CORPORATION, Tokyo (JP)

(*) Notice: Subject to any disclaimer, the term of this patent is extended or adjusted under 35 U.S.C. 154(b) by 579 days.

(21) Appl. No.: 17/648,462

(22) Filed: Jan. 20, 2022

(65) Prior Publication Data

US 2022/0246461 A1     Aug. 4, 2022

(30) Foreign Application Priority Data

Jan. 29, 2021    (JP) ................. 2021-012906

(51) Int. Cl.
    *H01L 21/683*      (2006.01)
    *B23K 26/50*      (2014.01)
    *H10D 89/00*      (2025.01)

(52) U.S. Cl.
CPC .......... *H01L 21/6836* (2013.01); *B23K 26/50* (2015.10); *H10D 89/011* (2025.01); *H01L 2221/68327* (2013.01)

(58) Field of Classification Search
None
See application file for complete search history.

(56) References Cited

U.S. PATENT DOCUMENTS

| | | | | |
|---|---|---|---|---|
| 2004/0002199 A1* | 1/2004 | Fukuyo | ................. | C03B 33/023 438/106 |
| 2004/0097054 A1* | 5/2004 | Abe | ................... | H01L 21/6836 257/E21.705 |
| 2007/0249146 A1* | 10/2007 | Masuda | ............ | H01L 21/67132 438/464 |
| 2010/0267219 A1* | 10/2010 | Kajiyama | .......... | H01L 33/0093 257/E21.599 |
| 2018/0175006 A1 | 6/2018 | Yan et al. | | |
| 2021/0358886 A1* | 11/2021 | Periyannan | ............. | H01L 24/06 |

FOREIGN PATENT DOCUMENTS

| | | |
|---|---|---|
| CN | 108206169 A | 6/2018 |
| JP | 2006005080 A | 1/2006 |
| JP | 2006012902 A | 1/2006 |

(Continued)

OTHER PUBLICATIONS

Chinese Office Action issued in counterpart Taiwanese patent application No. 111103153, dated Dec. 19, 2024.

(Continued)

*Primary Examiner* — Cory W Eskridge
(74) *Attorney, Agent, or Firm* — Greer Burns & Crain Ltd.

(57) ABSTRACT

A manufacturing method of chips includes forming modified layers that become points of origin of dividing along planned dividing lines, grinding the back surface of the wafer by grinding abrasive stones to thin the wafer into a finished thickness, and dividing the wafer into the chips along the planned dividing lines using the modified layers as the points of origin. The manufacturing method also includes sticking an expanding tape having elasticity to the back surface of the wafer for which grinding processing has been executed, expanding the expanding tape and widening the interval between the respective chips along the planned dividing lines.

7 Claims, 7 Drawing Sheets

(56) References Cited

FOREIGN PATENT DOCUMENTS

| | | |
|---|---|---|
| JP | 2013055138 A | 3/2013 |
| JP | 2014011445 A | 1/2014 |
| JP | 2015230964 A | 12/2015 |
| JP | 2017108086 A | 6/2017 |
| JP | 2018041823 A | 3/2018 |
| JP | 2019087633 A | 6/2019 |
| JP | 2019197805 A | 11/2019 |
| JP | 2020107741 A | 7/2020 |

OTHER PUBLICATIONS

Office Action issued in counterpart Japanese patent application No. 2021-012906, dated Oct. 29, 2024.
Office Action issued in counterpart Japanese patent application No. 2021-012906, dated Apr. 1, 2025.

* cited by examiner

MANUFACTURING METHOD OF CHIPS AND TAPE STICKING APPARATUS

BACKGROUND OF THE INVENTION

Field of the Invention

The present invention relates to a manufacturing method of chips and a tape sticking apparatus.

Description of the Related Art

Thin device chips are manufactured by grinding and thinning a wafer from a back surface side and subsequently dividing the wafer along planned dividing lines.

The dividing of the wafer is executed by cutting by a cutting blade or ablation processing by irradiation with a laser beam, for example. However, there is a problem that, when the wafer is divided by these methods, chipping occurs at an end part of the device chip formed by the dividing or distortion is caused in a side surface of the device chip in some cases and the flexural strength lowers.

Thus, a method for manufacturing device chips by a process referred to as a stealth dicing before grinding (SDBG) has been proposed (for example, refer to Japanese Patent Laid-open No. 2006-12902). In the process illustrated in Japanese Patent Laid-open No. 2006-12902, modified layers are formed inside a wafer along planned dividing lines and subsequently the wafer is ground from the back surface side to thereby divide the wafer and form device chips.

By the way, an adhesive film that functions as an adhesive when device chips are mounted and is referred to as a die attach film (DAF) is disposed on the back surface of the device chips to be manufactured in some cases. In the SDBG process, the DAF is stuck to the back surface of a wafer after the back surface side of the wafer is ground to thin the wafer and form device chips. Moreover, an expanding tape that can be expanded is stuck to the back surface side and this expanding tape is expanded by an expanding apparatus. Thereby, the DAF is divided and the device chips are manufactured (for example, refer to Japanese Patent Laid-open No. 2014-11445).

Here, normally the adhesive tape such as the expanding tape like that described above is stuck to a wafer that is a plate-shaped object while the adhesive tape is pressed by using a roller or the like (for example, refer to Japanese Patent Laid-open No. 2006-5080).

SUMMARY OF THE INVENTION

However, it has turned out that the expanding tape is not favorably stuck to a wafer in some cases and a tensile force does not act even when the expanding tape is expanded and therefore a problem that it is impossible to properly divide the DAF and the wafer occurs.

A method in which the expanding tape is stuck to a wafer by strongly pressing the expanding tape has also been studied. However, there is a fear that a crack extends in an unintended direction from a modified layer previously formed and a product defect is caused.

Thus, an object of the present invention is to provide a manufacturing method of chips and a tape sticking apparatus that allow suppression of failure in dividing and a product defect.

In accordance with an aspect of the present invention, there is provided a manufacturing method of chips by which a wafer having devices in regions marked out by a plurality of planned dividing lines that are set in a front surface and intersect is divided to manufacture the chips. The manufacturing method includes a modified layer forming step of positioning the focal point of a laser beam with a wavelength having transmissibility with respect to the wafer to the inside of the wafer and executing irradiation to form modified layers that become points of origin of dividing along the planned dividing lines and a grinding step of grinding a back surface of the wafer by grinding means to thin the wafer into a finished thickness and dividing the wafer into the chips along the planned dividing lines with use of the modified layers as the points of origin after the modified layer forming step. The manufacturing method includes also an expanding tape sticking step of sticking an expanding tape having elasticity to the back surface of the wafer for which grinding processing has been executed after the grinding step and an expanding step of expanding the expanding tape and widening an interval between the chips along the planned dividing lines. The expanding tape sticking step causes a pressing roller to operate two or more times when the expanding tape is pressed against and stuck to the back surface of the wafer.

Preferably, the manufacturing method of the chips further includes an adhesive film sticking step of sticking an adhesive film for die bonding to the back surface of the wafer for which the grinding processing has been executed after the grinding step.

In accordance with another aspect of the present invention, there is provided the tape sticking apparatus that sticks a tape to a wafer. The tape sticking apparatus has a tape feed-out part around which a tape body in which a strip-shaped adhesive tape including an adhesive layer on a single surface of a base is temporarily bonded to a release sheet is set in a state of being wound into a roll shape. The tape feed-out part feeds out the adhesive tape with such an orientation that the side of the release sheet is the lower side. The tape sticking apparatus has also a sheet separating part that separates the release sheet from the adhesive tape fed out from the tape feed-out part, a release sheet take-up part that takes up the release sheet separated by the sheet separating part, and a pressing roller that presses the adhesive tape against the wafer in such a manner that a sticking surface of the adhesive tape fed out by the tape feed-out part is made opposed to the wafer. The pressing roller is set to press the adhesive tape against the wafer a plurality of times to allow prevention of application of an excessive pressure to the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Furthermore, what can be easily envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

Figure 1:
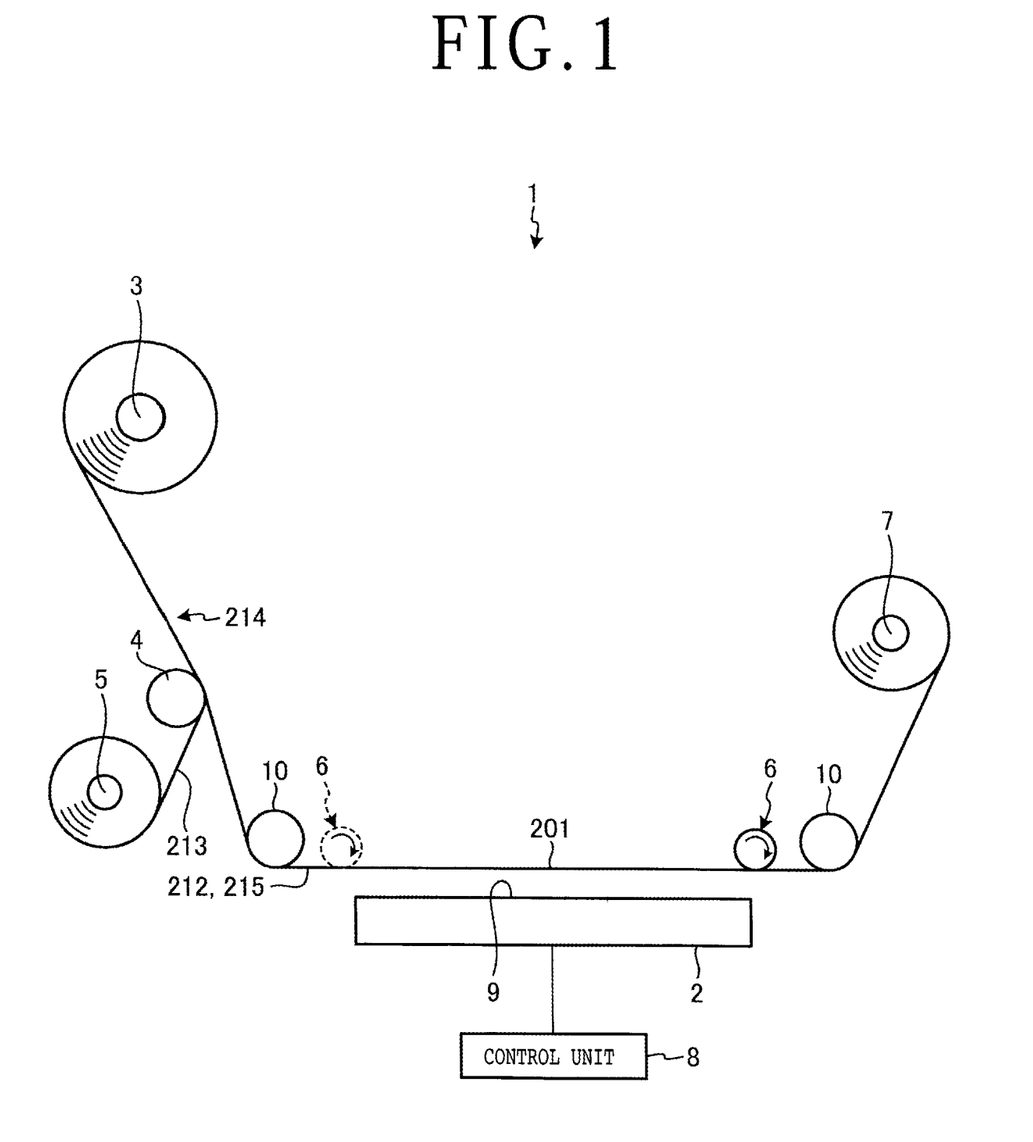
FIG. 1 is a side view schematically illustrating an outline configuration of a tape sticking apparatus according to an embodiment.
Figure 2:
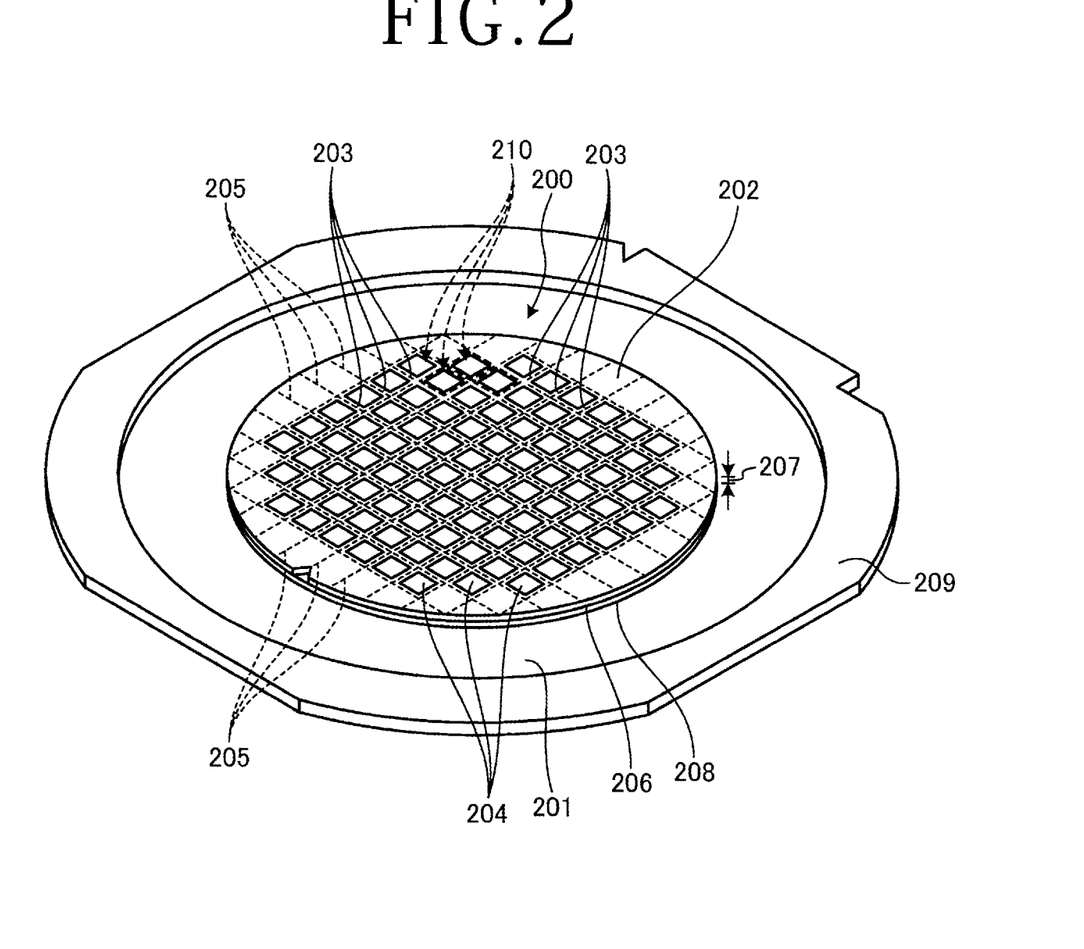
FIG. 2 is a perspective view of a wafer to which an expanding tape is stuck by the tape sticking apparatus illustrated in FIG. 1.
Figure 3:
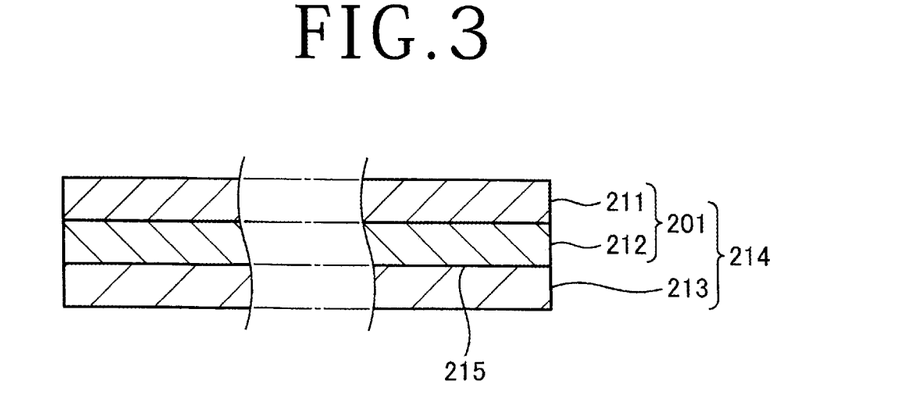
FIG. 3 is an enlarged sectional view of the expanding tape stuck to the wafer by the tape sticking apparatus illustrated in FIG. 1.

A tape sticking apparatus according to the embodiment of the present invention will be described based on the drawings. FIG. 1 is a side view schematically illustrating an outline configuration of the tape sticking apparatus according to the embodiment. FIG. 2 is a perspective view of a wafer to which an expanding tape is stuck by the tape sticking apparatus illustrated in FIG. 1. FIG. 3 is a sectional view of the expanding tape stuck to the wafer by the tape sticking apparatus illustrated in FIG. 1.

A tape sticking apparatus 1 illustrated in FIG. 1 according to the embodiment is an apparatus that sticks an expanding tape 201 (equivalent to the tape and the adhesive tape) to a wafer 200 as illustrated in FIG. 2. The wafer 200 to which the expanding tape 201 is stuck by the tape sticking apparatus 1 according to the embodiment is a circular plate-shaped semiconductor wafer, an optical device wafer, or the like including silicon (Si), sapphire ($Al_2O_3$), gallium arsenide (GaAs), silicon carbide (SiC), or the like as a substrate.

As illustrated in FIG. 2, the wafer 200 has devices 204 in the respective regions marked out by plural planned dividing lines 203 set in a front surface 202. The device 204 is, for example, a circuit such as an integrated circuit (IC) or large scale integration (LSI), an image sensor of a charge coupled device (CCD), complementary metal oxide semiconductor (CMOS), or the like, or micro electro mechanical systems (MEMS), or the like.

In the embodiment, modified layers 205 are formed inside the substrate of the wafer 200 along the planned dividing lines 203 and the wafer 200 is thinned to a predetermined finished thickness 207 through grinding of the side of a back surface 206 on the back side of the front surface 202. For the wafer 200, a die attach film (DAF) 208 that is an adhesive film for die bonding and the expanding tape 201 are stuck to the side of the back surface 206 and an annular frame 209 having an inner diameter larger than an outer diameter of the wafer 200 is stuck to the outer edge part of the expanding tape 201, and the wafer 200 is supported inside the annular frame 209. The wafer 200 is divided into individual chips 210 along the planned dividing lines 203. The chip 210 includes one part of the substrate and the device 204.

The modified layer 205 means a region in which the density, the refractive index, the mechanical strength, or another physical property has become a state different from that of the surroundings, and a melting treatment region, a crack region, an electrical breakdown region, a refractive index change region, a region in which these regions exist in a mixed manner, and so forth can be cited as examples. Furthermore, the modified layers 205 have lower mechanical strength and so forth than the other part of the substrate of the wafer 200. The DAF 208 is an adhesive film for die bonding for fixing the chip 210 to another chip, a substrate, or the like. In the embodiment, the DAF 208 is formed into a circular plate shape having the same outer diameter as the wafer 200 and is divided for each of the individual chips 210.

In the embodiment, as illustrated in FIG. 3, the expanding tape 201 stuck to the wafer 200 by the tape sticking apparatus 1 includes a base 211 composed of a resin that is non-adhesive and has elasticity and flexibility and an adhesive layer 212 that is stacked on a single surface of the base 211 and has adhesiveness, elasticity, and flexibility. Thus, the expanding tape 201 has elasticity. Furthermore, for the expanding tape 201, in a strip-shaped state, the adhesive layer 212 is temporarily bonded to a release sheet 213, and the expanding tape 201 is set on the tape sticking apparatus 1 in the state of a tape body 214 in which the release sheet 213 is temporarily bonded to the adhesive layer 212. The being temporarily bonded refers to the state in which the release sheet 213 is bonded to the adhesive layer 212 in such a manner as to be allowed to be freely separated.

(Tape Sticking Apparatus)

As illustrated in FIG. 1, the tape sticking apparatus 1 has a chuck table 2, a tape feed-out part 3, a sheet separating part 4, a release sheet take-up part 5, a pressing roller 6, a relative movement part that is not illustrated in the diagram, a tape cutting part that is not illustrated in the diagram, an unnecessary tape take-up part 7, and a control unit 8.

The chuck table 2 is what holds the wafer 200 and the annular frame 209. In the chuck table 2, the upper surface includes a holding surface 9 flatly formed along the horizontal direction. The wafer 200 and the annular frame 209 carried in by a conveying unit that is not illustrated in the diagram are placed on the holding surface 9 and the chuck table 2 holds them.

Around the tape feed-out part 3, the tape body 214 in which the expanding tape 201 with a strip shape is temporarily bonded to the release sheet 213 is set in the state of being wound into a roll shape. The tape feed-out part 3 feeds out the expanding tape 201 toward the upper side of the holding surface 9 of the chuck table 2 with such an orientation that the side of the release sheet 213 is the lower side. In the embodiment, the tape feed-out part 3 is disposed on one side that is the left side in FIG. 1 relative to the chuck table 2 in the horizontal direction and is formed into a circular column shape in which the axial center is parallel to the horizontal direction, and is disposed rotatably around the axial center. The tape body 214 wound into the roll shape with the release sheet 213 located outside is wound on the outer circumferential surface of the tape feed-out part 3, so that the tape body 214 is set. In the embodiment, for the tape body 214, the release sheet 213 is separated by the sheet separating part 4 from an end part sequentially, and the expanding tape 201 is stuck to the wafer 200 and the annular frame 209.

The sheet separating part 4 is what separates the release sheet 213 from the expanding tape 201 fed out from the tape feed-out part 3. The sheet separating part 4 is disposed between the tape feed-out part 3 and the chuck table 2 and is formed into a circular column shape in which the axial center is parallel to the axial center of the tape feed-out part 3, and is supported rotatably around the axial center. The outer circumferential surface of the sheet separating part 4 abuts against the release sheet 213 of the tape body 214 and the sheet separating part 4 rotates around the axial center in association with the feeding-out of the tape body 214 from the tape feed-out part 3 to the upper side of the holding surface 9 of the chuck table 2. The sheet separating part 4 separates the release sheet 213 from the tape body 214 due to the abutting of its outer circumferential surface against the release sheet 213 of the tape body 214 and feeds out the expanding tape 201 toward the upper side of the holding surface 9 of the chuck table 2.

The release sheet take-up part 5 is what takes up the release sheet 213 separated by the sheet separating part 4 from the tape body 214 fed out from the tape feed-out part 3. In the embodiment, the release sheet take-up part 5 is disposed under the tape feed-out part 3. The release sheet take-up part 5 is formed into a circular column shape in which the axial center is parallel to the axial centers of the tape feed-out part 3 and the sheet separating part 4, and takes up the release sheet 213 separated from the tape body 214 on the outer circumferential surface by being rotated around the axial center by a drive device such as a motor that is not illustrated in the diagram.

Furthermore, the tape sticking apparatus 1 includes a pair of tension giving parts 10. The tension giving parts 10 are formed into a circular column shape in which the axial center is parallel to the axial centers of the tape feed-out part 3, the sheet separating part 4, and the release sheet take-up part 5, and are disposed rotatably around the axial center. One tension giving part 10 is disposed over the holding surface 9 of the chuck table 2 and on one side that is the left side in FIG. 1 relative to the chuck table 2 in the horizontal direction. The other tension giving part 10 is disposed over the holding surface 9 of the chuck table 2 and on the other side that is the right side in FIG. 1 relative to the chuck table 2 in the horizontal direction. The expanding tape 201 fed out from the tape feed-out part 3 to the upper side of the holding surface 9 of the chuck table 2 is brought into contact with the outer circumferential surfaces of the tension giving parts 10, and the tension giving parts 10 rotate around the axial center in association with the feeding-out of the expanding tape 201 and give tension in order to suppress the occurrence of slackening in the expanding tape 201.

The pressing roller 6 is what presses the expanding tape 201 against the wafer 200 and the annular frame 209 on the holding surface 9 in such a manner that an adhesive surface 215 that is the surface of the adhesive layer 212 of the expanding tape 201 fed out to the upper side of the holding surface 9 of the chuck table 2 by the tape feed-out part 3 is made opposed to the wafer 200. The pressing roller 6 is formed into a circular column shape in which the axial center is parallel to the axial centers of the tape feed-out part 3, the sheet separating part 4, the release sheet take-up part 5, and the tension giving parts 10, and is disposed rotatably around the axial center.

The pressing roller 6 is disposed movably in the direction that is parallel to the horizontal direction and is orthogonal to the above-described axial center relative to the chuck table 2 by the relative movement part that is not illustrated in the diagram, and is disposed movably in the vertical direction. The pressing roller 6 is moved relative to the chuck table 2 in the vertical direction while being moved relative to the chuck table 2 in the direction that is parallel to the horizontal direction and is orthogonal to the above-described axial center by the relative movement part. Thereby, the pressing roller 6 presses the adhesive surface 215 of the expanding tape 201 against the wafer 200 and the annular frame 209 on the holding surface 9 while moving along the holding surface 9 and rolling on the base 211, and sticks the expanding tape 201 to the wafer 200 and the annular frame 209 on the holding surface 9. Furthermore, the pressing roller 6 can change the pressure of pressing the expanding tape 201 against the wafer 200 by being moved relative to the chuck table 2 along the vertical direction by the relative movement part. Moreover, in the present invention, the pressing roller 6 may be incapable of changing the pressure of pressing the expanding tape 201 against the wafer 200.

The tape cutting part is what cuts a part between the inner edge and the outer edge of the annular frame 209 in the expanding tape 201 stuck to the wafer 200 and the annular frame 209.

The unnecessary tape take-up part 7 is what takes up the unnecessary part of the expanding tape 201 resulting from the cutting of the part between the inner edge and the outer edge of the annular frame 209 by the tape cutting part. In the embodiment, the unnecessary tape take-up part 7 is disposed on the other side that is the right side in FIG. 1 relative to the chuck table 2 in the horizontal direction and is formed into a circular column shape in which the axial center is parallel to the axial centers of the tape feed-out part 3, the sheet separating part 4, the release sheet take-up part 5, the tension giving parts 10, and the pressing roller 6. The unnecessary tape take-up part 7 takes up the unnecessary part of the expanding tape 201 on the outer circumferential surface by being rotated around the axial center by a drive device such as a motor that is not illustrated in the diagram.

The control unit 8 is what controls each of the above-described respective constituent elements that configure the tape sticking apparatus 1 and causes the tape sticking apparatus 1 to execute an operation of sticking the expanding tape 201 to the wafer 200 and the annular frame 209. The control unit 8 is a computer that has a calculation processing device having a microprocessor such as a central processing unit (CPU), a storing device having a memory such as a read only memory (ROM) or a random access memory (RAM), and an input-output interface device and can execute a computer processing.

The calculation processing device of the control unit 8 executes, on the RAM, the computer program stored in the ROM and generates a control signal for controlling the tape sticking apparatus 1. The calculation processing device of the control unit 8 outputs the generated control signal to the respective constituent elements of the tape sticking apparatus 1 through the input-output interface device.

Furthermore, to the control unit 8, a display unit configured by a liquid crystal display device or the like that displays the state of the sticking operation, images, and so forth and an input unit used when an operator registers information on the contents of processing or the like are connected. The input unit is configured by at least one of a touch panel disposed on the display unit, a keyboard, and so forth.

(Manufacturing Method of Chips)

Figure 4:
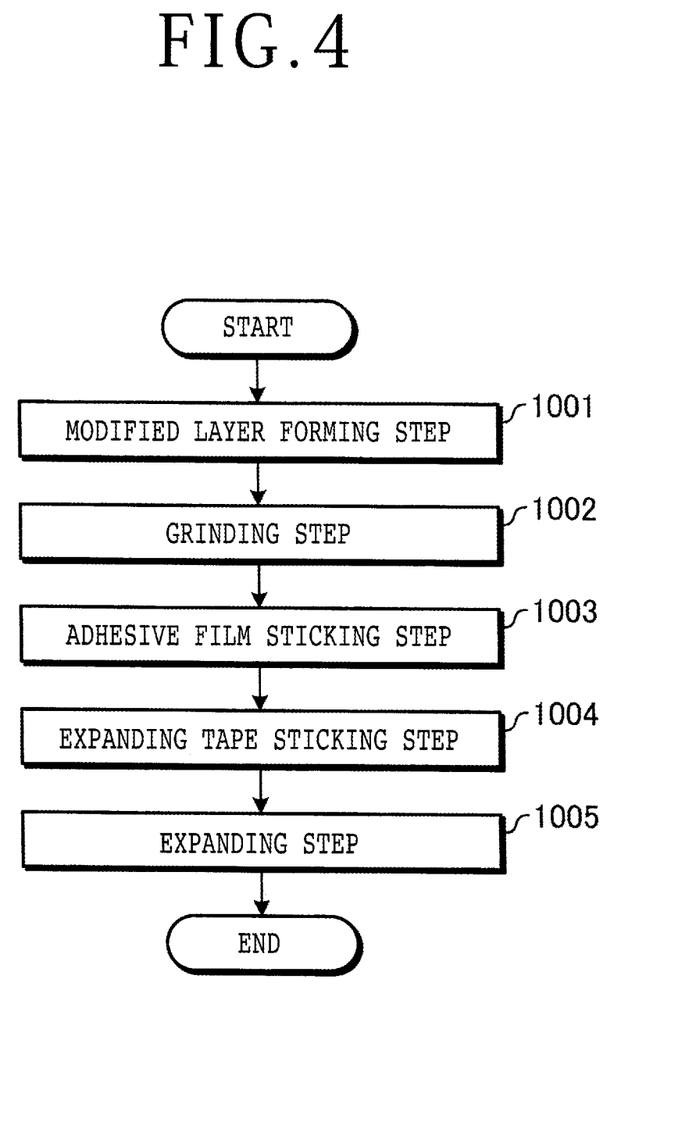
FIG. 4 is a flowchart illustrating a flow of a manufacturing method of the chips according to the embodiment.

Next, a manufacturing method of chips according to the embodiment will be described based on drawings. FIG. 4 is a flowchart illustrating the flow of the manufacturing method of the chips according to the embodiment. The manufacturing method of the chips according to the embodiment is a method in which the wafer 200 having the devices 204 in the regions marked out by the plural planned dividing lines 203 set in the front surface 202 is divided along the planned dividing lines 203 to manufacture the chips 210. As illustrated in FIG. 4, the manufacturing method of the chips according to the embodiment includes a modified layer forming step 1001, a grinding step 1002, an adhesive film sticking step 1003, an expanding tape sticking step 1004, and an expanding step 1005.

(Modified Layer Forming Step)

Figure 5:
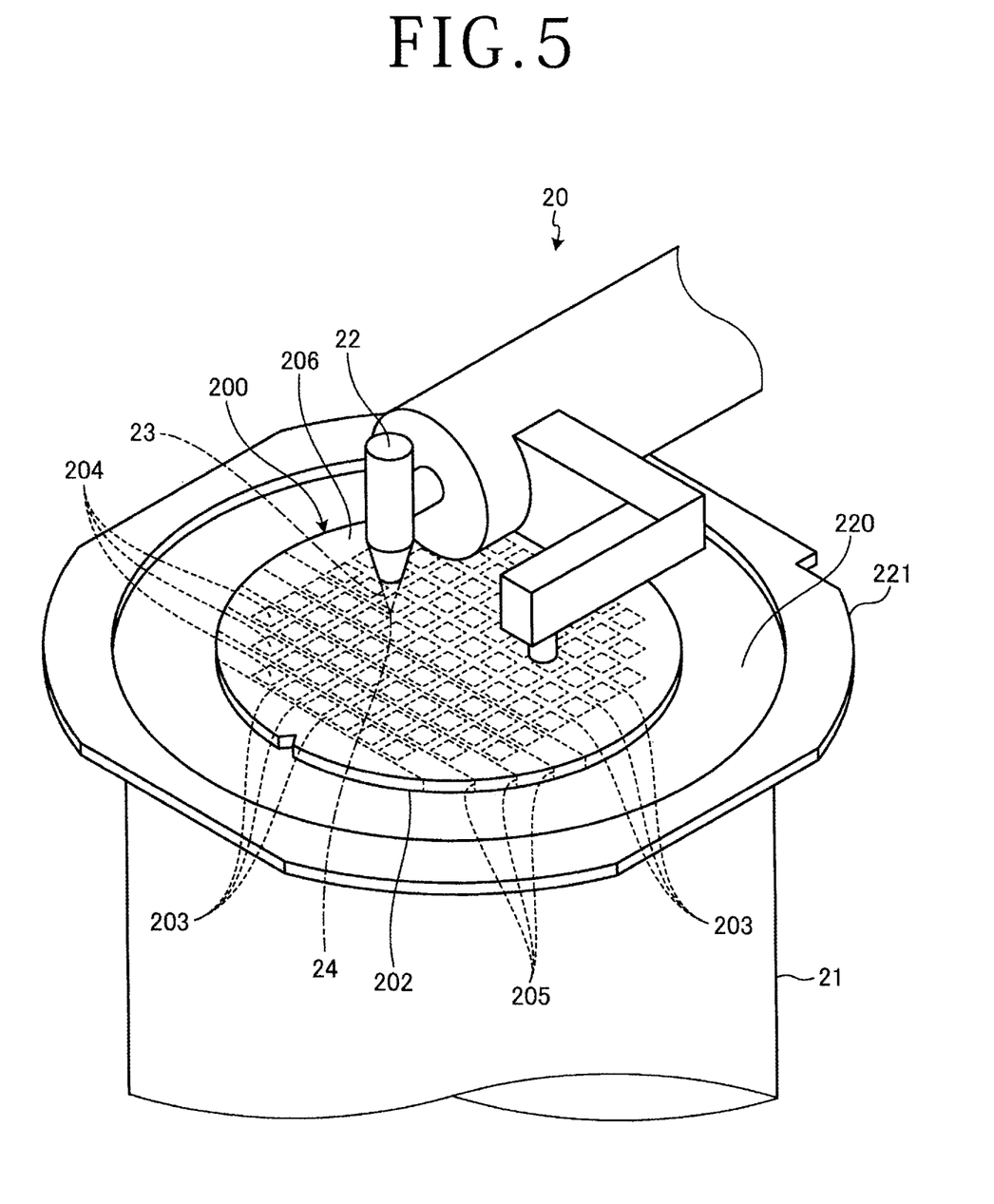
FIG. 5 is a perspective view schematically illustrating a modified layer forming step in the manufacturing method of chips illustrated in FIG. 4.

FIG. 5 is a perspective view schematically illustrating the modified layer forming step in the manufacturing method of the chips illustrated in FIG. 4. The modified layer forming step 1001 is a step of positioning a focal point 24 of a laser beam 23 with a wavelength having transmissibility with respect to the wafer 200 (in the embodiment, 1030 to 1310 nm) to the inside of the substrate of the wafer 200 and executing irradiation to form the modified layers 205 that become points of origin of dividing along the planned dividing lines 203.

In the embodiment, in the modified layer forming step 1001, a central part of a protective tape 220 with a circular plate shape having a larger diameter than the wafer 200 is stuck to the side of the front surface 202 of the wafer 200 and an annular frame 221 having an inner diameter larger than the diameter of the wafer 200 is stuck to the outer edge part of the protective tape 220. In the embodiment, in the modified layer forming step 1001, the laser processing apparatus 20 sucks and holds the side of the front surface 202 of the wafer 200 over the holding surface of a chuck table 21 with the interposition of the protective tape 220. In the modified layer forming step 1001, as illustrated in FIG. 5, the focal point 24 of a laser beam irradiation unit 22 is set to the inside of the substrate and the laser processing apparatus 20 executes irradiation with the pulsed laser beam 23 from the side of the back surface 206 of the wafer 200 along the planned dividing lines 203 while relatively moving the chuck table 21 and the laser beam irradiation unit 22 along the planned dividing lines 203.

In the embodiment, in the modified layer forming step 1001, the laser processing apparatus 20 irradiates the wafer 200 sucked and held by the chuck table 21 with the laser beam 23 from the laser beam irradiation unit 22 while moving the chuck table 21. In the modified layer forming step 1001, the laser processing apparatus 20 executes the irradiation with the laser beam 23 having a wavelength having transmissibility with respect to the wafer 200. Therefore, as illustrated in FIG. 5, the modified layers 205 along the planned dividing lines 203 are formed inside the substrate. In the modified layer forming step 1001, the laser processing apparatus 20 forms the modified layers 205 inside the substrate along all planned dividing lines 203.

In the present invention, in the modified layer forming step 1001, a protective tape may be stuck to the back surface 206 of the wafer 200 and irradiation with the laser beam 23 may be executed from the side of the front surface 202 of the wafer 200 to form the modified layers 205 inside the substrate, and thereafter the protective tape 220 may be stuck to the side of the front surface 202 of the wafer 200 and the protective tape on the side of the back surface 206 may be separated. In short, in the present invention, the wafer 200 may be transferred to the protective tape 220 after the wafer 200 is irradiated with the laser beam 23.

(Grinding Step)

Figure 6:
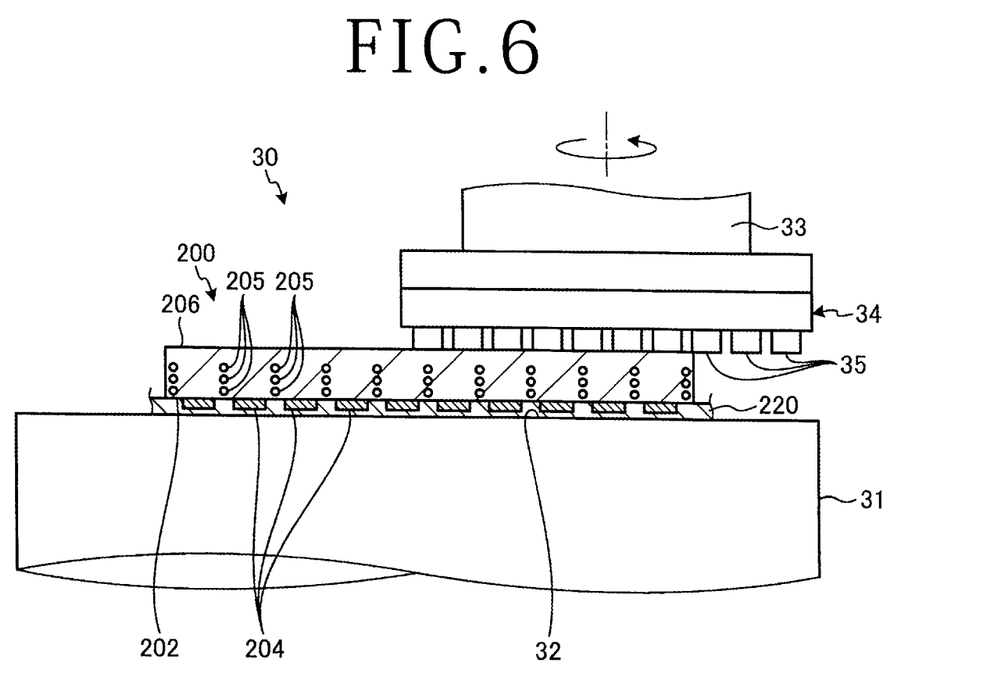
FIG. 6 is a partial sectional side view schematically illustrating a grinding step in the manufacturing method of the chips illustrated in FIG. 4.

FIG. 6 is a partial sectional side view schematically illustrating the grinding step in the manufacturing method of the chips illustrated in FIG. 4. The grinding step 1002 is a step of grinding the side of the back surface 206 of the wafer 200 by grinding abrasive stones 35 that are grinding means to thin the wafer 200 into the finished thickness 207 and dividing the wafer 200 into the individual chips 210 along the planned dividing lines 203 with use of the modified layers 205 as the points of origin after executing the modified layer forming step 1001.

In the embodiment, in the grinding step 1002, the grinding apparatus 30 sucks and holds the side of the front surface 202 of the wafer 200 over a holding surface 32 of a chuck table 31 with the interposition of the protective tape 220. In the grinding step 1002, as illustrated in FIG. 6, a grinding wheel 34 is rotated around the axial center by a spindle 33 and the chuck table 31 is rotated around the axial center. Furthermore, while a grinding liquid that is not illustrated in the diagram, such as purified water, is supplied, the grinding abrasive stones 35 of the grinding wheel 34 are made to abut against the back surface 206 of the wafer 200 and are brought closer to the chuck table 31 at a predetermined feed rate. Thereby, the back surface 206 of the wafer 200 is ground by the grinding abrasive stones 35 and the wafer 200 is thinned. In the grinding step 1002, the wafer 200 is divided into the individual chips 210 along the planned dividing lines 203 with the modified layers 205 being the points of origin due to the load applied by the grinding. In the embodiment, in the grinding step 1002, the grinding apparatus 30 thins the wafer 200 to the finished thickness 207.

(Adhesive Film Sticking Step)

Figure 7:
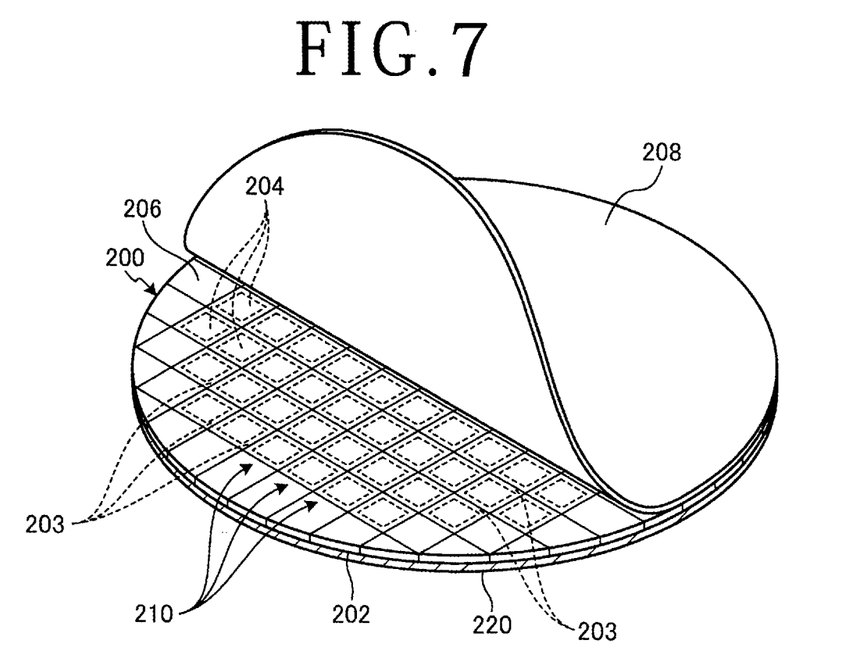
FIG. 7 is a perspective view schematically illustrating an adhesive film sticking step in the manufacturing method of the chips illustrated in FIG. 4.

FIG. 7 is a perspective view schematically illustrating the adhesive film sticking step in the manufacturing method of the chips illustrated in FIG. 4. FIG. 7 illustrates only the circular plate-shaped part with the same diameter as the wafer 200 in the protective tape 220, and the other part of the protective tape 220 and the annular frame 209 are omitted.

The adhesive film sticking step 1003 is a step of sticking the DAF 208 to the back surface 206 of the wafer 200 for which the grinding processing has been executed after the grinding step 1002 and before the expanding tape sticking step 1004. In the embodiment, in the adhesive film sticking step 1003, as illustrated in FIG. 7, the DAF 208 is stuck to the back surface 206 of the wafer 200 and the protective tape 220 is separated from the front surface 202.

(Expanding Tape Sticking Step)

Figure 8:
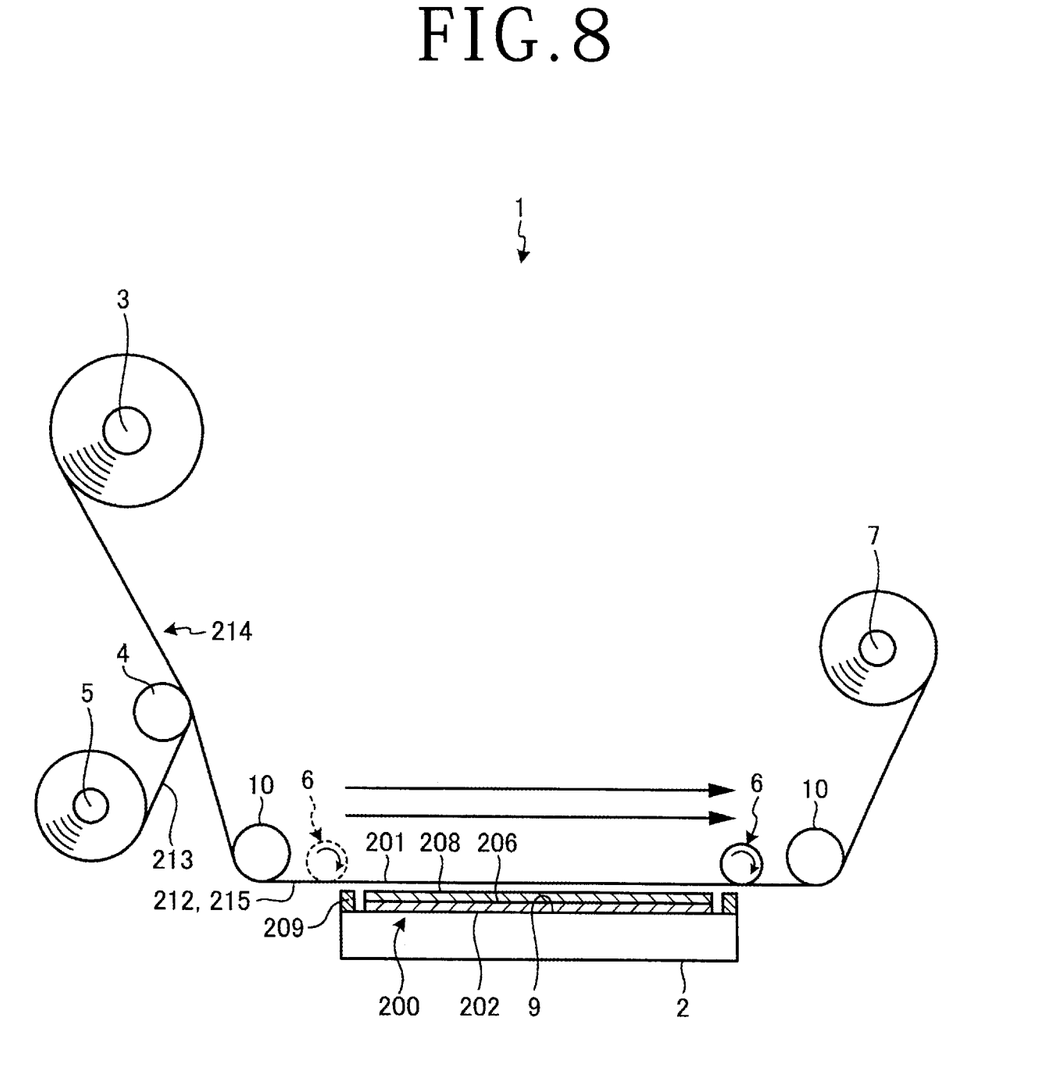
FIG. 8 is a side view schematically illustrating an expanding tape sticking step in the manufacturing method of the chips illustrated in FIG. 4.

FIG. 8 is a side view schematically illustrating the expanding tape sticking step in the manufacturing method of the chips illustrated in FIG. 4. The expanding tape sticking step 1004 is a step of sticking the expanding tape 201 having elasticity to the back surface 206 of the wafer 200 for which the grinding processing has been executed after the grinding step 1002.

In the embodiment, in the expanding tape sticking step 1004, as illustrated in FIG. 8, the tape sticking apparatus 1 holds the side of the front surface 202 of the wafer 200 and the annular frame 209 on the holding surface 9 of the chuck table 2. Then, the tape sticking apparatus 1 causes the expanding tape 201 pulled out from the tape body 214 set around the tape feed-out part 3 to abut against the outer circumferential surface of the sheet separating part 4 and winds the release sheet 213 around the release sheet take-up part 5. Furthermore, the tape sticking apparatus 1 causes the expanding tape 201 to pass under the tension giving parts 10 and be wound around the unnecessary tape take-up part 7 and guides the expanding tape 201 to over the holding surface 9 of the chuck table 2 in the state in which the adhesive layer 212 faces the wafer 200 and the annular frame 209.

In the expanding tape sticking step 1004, the tape sticking apparatus 1 relatively moves the pressing roller 6 and the chuck table 2 by the relative movement part and sticks the expanding tape 201 between the pair of tension giving parts 10 to the wafer 200 and the annular frame 209. In the embodiment, in the expanding tape sticking step 1004, the control unit 8 of the tape sticking apparatus 1 controls the relative movement part to position the pressing roller 6 above one end part of the wafer 200 on the left side in FIG. 8 that is the upstream side of the movement direction of the expanding tape 201. Thereafter, the pressing roller 6 is brought close to the chuck table 2 to stick the expanding tape 201 onto one end part of the DAF 208 stuck to the back surface 206 of the wafer 200. Then, while being pressed against the back surface 206 of the wafer 200, the pressing roller 6 is moved along the back surface 206 of the wafer 200 toward above the other end part of the wafer 200 on the right side in FIG. 8 that is the downstream side of the movement direction of the expanding tape 201 and is rolled on the expanding tape 201.

In the embodiment, in the expanding tape sticking step 1004, the tape sticking apparatus 1 sticks the expanding tape 201 sequentially from the one end part toward the other end part of the DAF 208 stuck to the back surface 206 of the wafer 200, and causes the pressing roller 6 to get farther away from the chuck table 2 when having stuck the expanding tape to the other end part of the DAF 208. In the embodiment, the pressure at which the pressing roller 6 in the expanding tape sticking step 1004 presses the expanding tape 201 against the back surface 206 of the wafer 200 is equal to the pressure when existing tape sticking apparatus sticks the expanding tape 201. In the embodiment, the pressure at which the pressing roller 6 in the expanding tape sticking step 1004 presses the expanding tape 201 against the back surface 206 of the wafer 200 is 0.34 MPa (gauge pressure), for example.

Furthermore, in the embodiment, in the expanding tape sticking step 1004, the tape sticking apparatus 1 executes, plural times (i.e. two or more times), the operation when the pressing roller 6 sticks the expanding tape 201 to the DAF 208 stuck to the back surface 206 of the wafer 200 (this operation is equivalent to the operation of the pressing roller 6 and is operation in which the pressing roller 6 gets close to the chuck table 2 and moves from the one end part to the other end part and gets farther away from the chuck table 2 above the other end part). Thus, in the expanding tape sticking step 1004, the tape sticking apparatus 1 causes the pressing roller 6 to operate two or more times (for example, in the embodiment, two times) when pressing the expanding tape 201 against the back surface 206 of the wafer 200 to stick it. Furthermore, the tape sticking apparatus 1 prevents application of an excessive pressure to the wafer 200 in the expanding tape sticking step 1004 because the operation of the pressing roller 6 is set in such a manner as to press the expanding tape 201 against the wafer 200 plural times and the pressure of the pressing is the same pressure as the conventional pressure.

In the embodiment, in the expanding tape sticking step 1004, after causing the pressing roller 6 to operate two times to stick the expanding tape 201 to the DAF 208 stuck to the back surface 206 of the wafer 200 held by the chuck table 2 and the annular frame 209, the tape sticking apparatus 1 cuts a part between the inner edge and the outer edge of the annular frame 209 in the expanding tape 201 stuck to the wafer 200 and the annular frame 209 by the tape cutting part. In the embodiment, in the expanding tape sticking step 1004, the tape sticking apparatus 1 evacuates the pressing roller 6 and the tape cutting part from the expanding tape 201 between the pair of tension giving parts 10 and the wafer 200 for which the expanding tape 201 is stuck to the DAF 208 and the annular frame 209 are carried out from the holding surface 9 of the chuck table 2.

In the embodiment, the tape sticking apparatus 1 executes preparation for sticking of the expanding tape 201 to the next wafer 200 through evacuating the pressing roller 6 and the tape cutting part from the expanding tape 201 between the pair of tension giving parts 10 and taking up the expanding tape 201 around the unnecessary tape take-up part 7 by a length corresponding to the outer diameter of the circular plate-shaped expanding tape 201 stuck to the wafer 200, and so forth. As above, in the embodiment, in the expanding tape sticking step 1004, the expanding tape 201 is stuck to the DAF 208 stuck in the adhesive film sticking step 1003 and thereby the expanding tape 201 is stuck to the back surface 206 of the wafer 200 with the interposition of the DAF 208. However, in the present invention, in the expanding tape sticking step 1004, the expanding tape 201 for which the DAF 208 is stuck to the adhesive layer 212 in advance may be stuck to the back surface 206 of the wafer 200. That is, the adhesive film sticking step 1003 and the expanding tape sticking step 1004 may be simultaneously executed by the tape sticking apparatus 1.

(Expanding Step)

Figure 9:
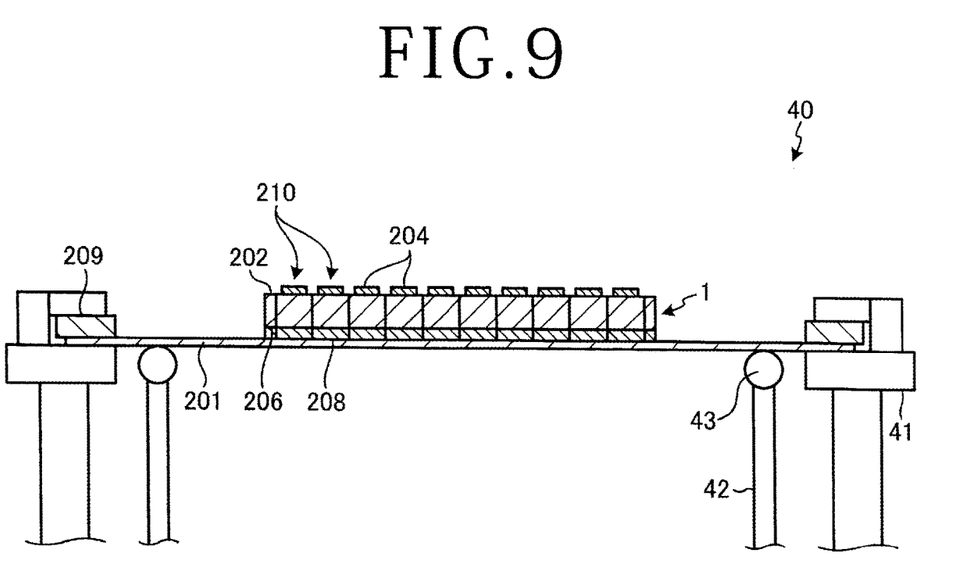
FIG. 9 is a partial sectional side view schematically illustrating a state in which an expanding apparatus holds the wafer in an expanding step in the manufacturing method of the chips illustrated in FIG. 4.
Figure 10:
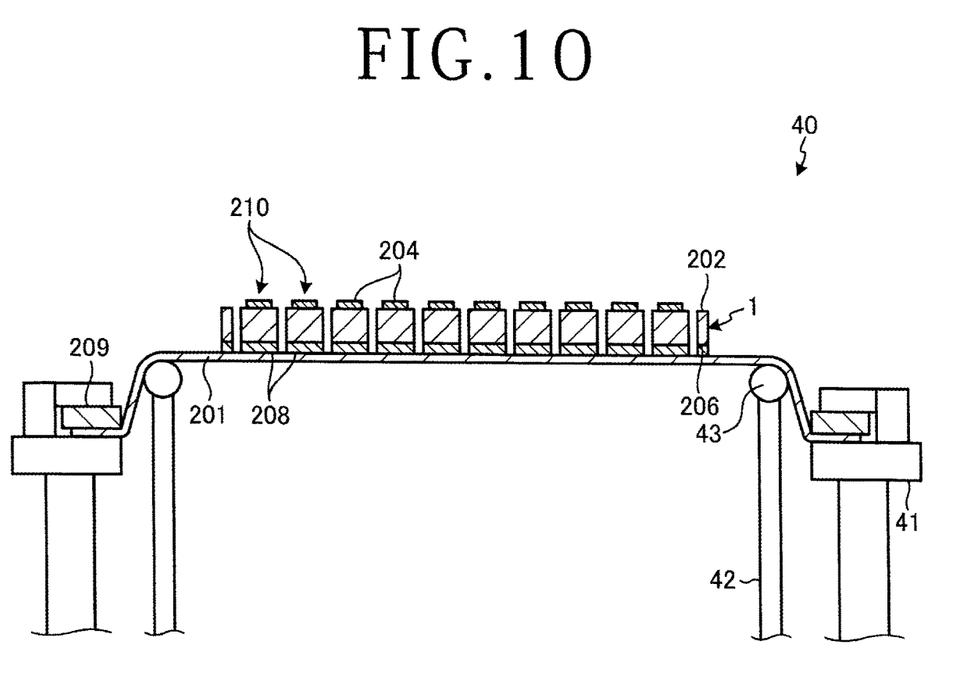
FIG. 10 is a partial sectional side view schematically illustrating a state in which the expanding apparatus has widened an interval between the chips in the expanding step in the manufacturing method of the chips illustrated in FIG. 4.

FIG. 9 is a partial sectional side view schematically illustrating the state in which the expanding apparatus holds the wafer in the expanding step in the manufacturing method of the chips illustrated in FIG. 4. FIG. 10 is a partial sectional side view schematically illustrating the state in which the expanding apparatus has widened the interval between the chips in the expanding step in the manufacturing method of the chips illustrated in FIG. 4.

The expanding step 1005 is a step of expanding the expanding tape 201 and widening the interval between the respective chips 210 along the planned dividing lines 203. In the expanding step 1005, as illustrated in FIG. 9, an expanding apparatus 40 clamps and holds, in a frame clamping part 41, the annular frame 209 that supports the wafer 200 inside and the outer edge part of the expanding tape 201 and causes a roller component 43 disposed at the upper end of a cylindrical expanding drum 42 to abut against the expanding tape 201.

In this manner, in the expanding step 1005, as illustrated in FIG. 9, the expanding apparatus 40 holds the annular frame 209 that supports the wafer 200 and so forth by the frame clamping part 41 in the state in which the expanding tape 201 is flat over the outer edge part and the central part. In the expanding step 1005, the expanding apparatus 40 relatively moves the annular frame 209 and the wafer 200 along a direction that intersects (in the present embodiment, orthogonal to) the front surface 202 of the wafer 200. In the embodiment, in the expanding step 1005, the expanding apparatus 40 raises the expanding drum 42 to relatively move the annular frame 209 and the wafer 200 along the direction that intersects (in the present embodiment, orthogonal to) the front surface 202 of the wafer 200 as illustrated in FIG. 10.

Thereupon, the roller component 43 presses a part between the outer edge of the wafer 200 and the inner edge of the annular frame 209 in the expanding tape 201 from the lower side toward the upper side and the expanding tape 201 is expanded in the surface direction. As the result of the expansion of the expanding tape 201, a tensile force acts on the expanding tape 201 in a radial manner. When the tensile force acts on the expanding tape 201 stuck to the back surface 206 of the wafer 200 in a radial manner, the interval between the chips 210 is widened because the wafer 200 has been divided into the individual chips 210 along the planned dividing lines 203. Furthermore, in the expanding step 1005, because the DAF 208 is stuck to the back surface 206 of the wafer 200 and the expanding tape 201 is stuck to the DAF 208, a tensile force in the expanding direction acts on the DAF 208 due to the expansion of the expanding tape 201 and the DAF 208 is split between the chips 210 and is divided for each of the respective chips 210. In this manner, in the wafer 200, the interval between the chips 210 is widened and the DAF 208 is divided for each chip 210. The chips 210 individually divided are picked up from the expanding tape 201 together with the DAF 208.

In the manufacturing method of the chips and the tape sticking apparatus 1 according to the embodiment described above, the pressing roller 6 is caused to operate plural times to stick the expanding tape 201 to the wafer 200. In addition, the pressure of the pressing by the pressing roller 6 is the same as the conventional pressure. Therefore, breakage of the wafer 200 in an unexpected direction such as a direction that intersects the planned dividing line 203 due to excessive pressurization can be suppressed. In addition, insufficiency of sticking of the expanding tape 201 to the DAF 208 can be suppressed. The manufacturing method of the chips and the tape sticking apparatus 1 according to the embodiment provide an effect that it becomes possible to manufacture the chips 210 without causing failure in the dividing of the DAF 208 and a product defect of the chip 210.

Next, the inventor of the present invention checked effects of the manufacturing method of the chips according to the above-described embodiment by dividing the same wafer 200 into the individual chips 210 and measuring the rate of the chip 210 diced into a single piece (hereinafter, referred to as the dividing rate) and checking whether or not a product defect (dividing at a place other than the planned dividing line 203) was present regarding each of comparative examples 1 and 2 and products 1 and 2 of the present invention. The result is illustrated in table 1.

TABLE 1

|  | Dividing rate | Product defect |
| --- | --- | --- |
| Product 1 of present invention | 100% | Absent |
| Product 2 of present invention | 100% | Absent |
| Comparative example 1 | 60% | Absent |
| Comparative example 2 | 80% | Present |

For comparative example 1 in table 1, in such a manner that the operation of the pressing roller 6 in the expanding tape sticking step 1004 in the manufacturing method of the chips according to the embodiment was executed one time and the pressure of the pressing by the pressing roller 6 was set to 0.34 MPa (a gauge pressure), the modified layer forming step 1001, the grinding step 1002, the adhesive film sticking step 1003, the expanding tape sticking step 1004, and the expanding step 1005 were sequentially executed to divide the wafer 200 into the individual chips 210.

For comparative example 2 in table 1, in such a manner that the operation of the pressing roller 6 in the expanding tape sticking step 1004 in the manufacturing method of the chips according to the embodiment was executed one time and the pressure of the pressing by the pressing roller 6 was set to 0.68 MPa (gauge pressure), the modified layer forming step 1001, the grinding step 1002, the adhesive film sticking step 1003, the expanding tape sticking step 1004, and the expanding step 1005 were sequentially executed to divide the wafer 200 into the individual chips 210.

For product 1 of the present invention in table 1, in such a manner that the operation of the pressing roller 6 in the expanding tape sticking step 1004 was executed two times and the pressure of the pressing by the pressing roller 6 was set to 0.34 MPa (gauge pressure), the manufacturing method of the chips according to the embodiment was executed to divide the wafer 200 into the individual chips 210.

For product 2 of the present invention in table 1, in such a manner that the operation of the pressing roller 6 in the expanding tape sticking step 1004 was executed two times and the pressure of the pressing by the pressing roller 6 was set to 0.34 MPa (gauge pressure), the manufacturing method of the chips according to the embodiment was executed to divide the wafer 200 into the individual chips 210 except that the expanding tape 201 to which the DAF 208 had been stuck in advance was stuck to the back surface 206 of the wafer 200 to simultaneously execute the adhesive film sticking step 1003 and the expanding tape sticking step 1004.

In the check about which the result is illustrated in table 1, the processing conditions of the modified layer forming step 1001, the grinding step 1002, and the expanding step 1005 for comparative examples 1 and 2 were made the same as those of the modified layer forming step 1001, the grinding step 1002, and the expanding step 1005 for the products 1 and 2 of the present invention.

According to table 1, in comparative examples 1 and 2, only 60% or 80% of the chips 210 could be diced into single pieces. In contrast to such comparative examples 1 and 2, 100% of the chips 210 could be diced into single pieces in the products 1 and 2 of the present invention. Furthermore, a product defect was present in comparative example 2 according to table 1. In contrast to such comparative example 2, a product defect was absent in the products 1 and 2 of the present invention.

Therefore, according to table 1, it has turned out that manufacturing the chips 210 without causing failure in the dividing of the DAF 208 and a product defect of the chip 210 is allowed by causing the pressing roller 6 to operate plural times in the expanding tape sticking step 1004 to stick the expanding tape 201 to the wafer 200 and making the pressure of the pressing the same as the conventional pressure.

The present invention is not limited to the above-described embodiment. That is, the present invention can be carried out with various modifications without departing from the gist of the present invention. For example, in the present invention, without sticking the DAF 208 to the back surface 206 of the wafer 200, i.e. without executing the adhesive film sticking step 1003, the expanding tape 201 may be stuck to the back surface 206 of the wafer 200 and the wafer 200 may be divided into the individual chips 210. Furthermore, in the present invention, in the expanding tape sticking step 1004, the expanding tape 201 may be stuck through causing the pressing roller 6 to operate plural times in such a manner that the pressing roller 6 is reciprocated between the one end part and the other end part described above. Moreover, in the present invention, not only forming the modified layers 205 in the wafer 200 but plasma dicing may be executed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of chips by which a wafer having devices in regions marked out by a plurality of planned dividing lines that are set in a front surface and intersect is divided to manufacture the chips, the manufacturing method comprising:
    a modified layer forming step of positioning a focal point of a laser beam with a wavelength having transmissibility with respect to the wafer to an inside of the wafer and executing irradiation to form modified layers that become points of origin of dividing along the planned dividing lines;
    a grinding step of grinding a back surface of the wafer by grinding means to thin the wafer into a finished thickness and dividing the wafer into the chips along the planned dividing lines with use of the modified layers as the points of origin after the modified layer forming step;
    an expanding tape sticking step of sticking an expanding tape having elasticity to the back surface of the wafer for which grinding processing has been executed after the grinding step; and
    an expanding step of expanding the expanding tape and widening an interval between the chips along the planned dividing lines, wherein:
    the expanding tape sticking step causes a pressing roller to operate two or more times when the expanding tape is pressed against and stuck to the back surface of the wafer, such that each time the expanding tape sticking step causes the pressing roller to operate, the pressing roller is moved in a movement direction of the expanding tape which is parallel to the back surface of the wafer from a first end of the wafer to a second end of the wafer.

2. The manufacturing method of chips according to claim 1, further comprising:
    an adhesive film sticking step of sticking an adhesive film for die bonding to the back surface of the wafer for which the grinding processing has been executed after the grinding step.

3. The manufacturing method of chips according to claim 1, wherein the expanding tape sticking step includes:
    causing the expanding tape to pass under tension giving parts of a tape sticking apparatus, where the tension giving parts are disposed above the wafer;
    moving a pressing roller into contacting relationship the expanding tape; and
    moving the pressing roller along the back surface of the wafer to press the expanding tape against the back surface of the wafer.

4. The manufacturing method of chips according to claim 3, wherein the expanding tape sticking step includes winding the expanding tape around an unnecessary tape take-up part of the tape sticking apparatus after the expanding sticking tape is passed under the tension giving parts.

5. The manufacturing method of chips according to claim 3, wherein the expanding tape sticking step includes separating a release tape from the expanding tape before the expanding sticking tape is passed under the tension giving parts.

6. The manufacturing method of chips according to claim 3, wherein the pressure that the pressing roller applies to the expanding tape is changed by changing a vertical distance between a chuck table holding the wafer and the pressing roller.

7. A manufacturing method of chips by which a wafer having devices in regions marked out by a plurality of planned dividing lines that are set in a front surface and intersect is divided to manufacture the chips, the manufacturing method comprising:
    a modified layer forming step of positioning a focal point of a laser beam with a wavelength having transmissibility with respect to the wafer to an inside of the wafer and executing irradiation to form modified layers that become points of origin of dividing along the planned dividing lines;
    a grinding step of grinding a back surface of the wafer by grinding means to thin the wafer into a finished thickness and dividing the wafer into the chips along the planned dividing lines with use of the modified layers as the points of origin after the modified layer forming step;
    an expanding tape sticking step of sticking an expanding tape having elasticity to the back surface of the wafer for which grinding processing has been executed after the grinding step; and
    an expanding step of expanding the expanding tape and widening an interval between the chips along the planned dividing lines, wherein:
    the expanding tape sticking step causes a pressing roller to operate two or more times when the expanding tape is pressed against and stuck to the back surface of the wafer, in such a manner that the pressing roller is reciprocated between a first end of the wafer and a second end of the wafer.

* * * * *